United States Patent
Manser et al.

(10) Patent No.: US 12,464,636 B2
(45) Date of Patent: Nov. 4, 2025

(54) POLYMER MICROWAVE FIBER TRANSCEIVER

(71) Applicant: HUBER+SUHNER AG, Herisau (CH)

(72) Inventors: Franz Manser, Herisau (CH); Ulf Hügel, Herisau (CH)

(73) Assignee: HUBER+SUHNER AG, Herisau (CH)

( * ) Notice: Subject to any disclaimer, the term of this patent is extended or adjusted under 35 U.S.C. 154(b) by 483 days.

(21) Appl. No.: 17/924,862

(22) PCT Filed: May 11, 2021

(86) PCT No.: PCT/EP2021/062529
§ 371 (c)(1),
(2) Date: Nov. 11, 2022

(87) PCT Pub. No.: WO2021/244828
PCT Pub. Date: Dec. 9, 2021

(65) Prior Publication Data
US 2023/0217582 A1    Jul. 6, 2023

(30) Foreign Application Priority Data
Jun. 3, 2020 (CH) .................................. 00656/20

(51) Int. Cl.
*H01Q 1/42* (2006.01)
*H01P 5/08* (2006.01)
(Continued)

(52) U.S. Cl.
CPC ............ *H05K 1/0237* (2013.01); *H01P 5/08* (2013.01); *H01Q 1/42* (2013.01); *H05K 7/1427* (2013.01)

(58) Field of Classification Search
CPC ... H01Q 1/42; H01P 5/08; H01P 5/087; H01P 5/16; H01P 5/1022; H05K 1/0237; H05K 7/1427
See application file for complete search history.

(56) References Cited

U.S. PATENT DOCUMENTS 6,407,652 B1 * 6/2002 Kan .................. H01R 24/50
333/260
7,883,373 B2 * 2/2011 Drew .................. H05K 5/069
439/589
(Continued)

FOREIGN PATENT DOCUMENTS

CN 109586027 A 4/2019
CN 110088976 A 8/2019
(Continued)

OTHER PUBLICATIONS

Myers, J.C., et al., "Crosstalk evaluation between ultra high speed multi-layer compatible PCB dielectric waveguides and reduction using split ring resonators," 2016 IEEE 25th Conference on Electrical Performance of Electronic Packaging and Systems (EPEPS), IEEE, Oct. 23, 2016, pp. 201-204, XP033053076, doi: 10.1109/EPEPS.2016.7835450.
(Continued)

*Primary Examiner* — Tung X Le
(74) *Attorney, Agent, or Firm* — Pauley Erickson & Swanson

(57) ABSTRACT

A PMF-transceiver (1) including a housing (2) with a recess (5) in which a printed circuit board (6) is arranged. The printed circuit board (6) includes at least one radiating element (7) in a mounted position interconnected to a thereto related PMF-cable (18) by a PMF-interposer (13) arranged between the printed circuit board (6) and the PMF-cable (18) and including a main body (14) arranged in a cavity (17) in the housing (2). The PMF-interposer (13) extends between the radiating element (7) and the PMF-cable (19).

20 Claims, 2 Drawing Sheets

(51) Int. Cl.
  *H05K 1/02* (2006.01)
  *H05K 7/14* (2006.01)

(56) References Cited

U.S. PATENT DOCUMENTS

| | | | |
|---|---|---|---|
| 9,478,842 B1 | 10/2016 | Decrossas et al. | |
| 11,482,766 B2 * | 10/2022 | Huber | H01P 3/16 |
| 2014/0285293 A1 | 9/2014 | Schuppener et al. | |
| 2016/0359223 A1 * | 12/2016 | Zhao | H01Q 1/42 |
| 2018/0316086 A1 * | 11/2018 | Lehman | H04W 76/40 |
| 2019/0081376 A1 * | 3/2019 | Takeda | H01P 3/14 |
| 2019/0097294 A1 | 3/2019 | Rusch et al. | |
| 2021/0305689 A1 * | 9/2021 | Leizerovich | H01Q 1/38 |

FOREIGN PATENT DOCUMENTS

| | | | |
|---|---|---|---|
| CN | 111164836 A | 5/2020 | |
| WO | WO 2018/137997 A1 | 8/2018 | |
| WO | WO 2019/072571 A1 | 4/2019 | |
| WO | WO 2020/126717 A1 | 6/2020 | |

OTHER PUBLICATIONS

Voineau, Florian, "Systèmes communicants haut-débit et bas coûts par guide d'ondes en plastique," Oct. 11, 2018, pp. 1-198, XP055820629, [Retrieved Jul. 2, 2021 from Internet]; URL:https://tel.archives-ouvertes.fr/tel-02094374.

Fukuda, S., et al., "A 12.5+12.5 Gb/s Full-Duplex Plastic Waveguide Interconnect," in IEEE Journal of Solid-State Circuits, vol. 46, No. 12, pp. 3113-3125, Dec. 2011, doi: 10.1109/JSSC.2011.2168870.

Distler, F., et al., "Design and characterization of a compact and robust shielded dielectric waveguide for mmW applications," 2018 11th German Microwave Conference (GeMiC), 2018, pp. 375-378, doi: 10.23919/GEMIC.2018.8335108.

EPO (Riswijk, NL), English language translation of the International Search Report, Form PCT/ISA/210, for International Application PCT/EP2021/062529, Jul. 14, 2021 (3 pages).

P.R. China, National IP Admin., English language translation of "Chinese Office Action for Chinese Patent Appln. No. 202180039075.9", issued on Apr. 1, 2025 (10 pages).

"Chinese Search Report" portion of the Chinese Office Action for Chinese Patent Application No. 202180039075.9, issued on Apr. 1, 2025 (3 pages).

* cited by examiner

POLYMER MICROWAVE FIBER TRANSCEIVER

CROSS REFERENCE TO RELATED APPLICATION

This application is a National Phase filing in the United States, under 35 USC § 371, of PCT International Patent Application PCT/EP2021/062529, filed on 11 May 2021 which claims the priority of Swiss Patent Application CH 00656/20 filed 3 Jun. 2020.

These applications are hereby incorporated by reference herein in their entirety and is made a part hereof, including but not limited to those portions which specifically appear hereinafter.

BACKGROUND OF THE INVENTION

Field of the Invention

The present disclosure relates to Polymer Microwave Fiber Transceiver (hereinafter PMF-Transceiver) for Data Communication Systems based on Polymer Microwave Fiber Transmission.

Discussion of Related Art

WO 19072571 A1 was published in April 2019 on behalf of the same applicant. It is directed to an interconnection assembly for a switching device in a server room. It comprises at least one cable with a core comprising a first dielectric material. The core is at least partially surrounded by a second dielectric material having a refractive index different from the first dielectric material. A first connector part is positioned with respect to at least one antenna comprising a fan-out element. The fan-out element comprises per antenna at least one hollow conductor arranged between the at least one antenna and the core of the at least one cable. The at least one hollow conductor extends in the fan-out element to guide a signal between the at least one antenna and the core of the at least one cable. The hollow conductor includes a first port aligned with the at least one antenna and a second port, which in an assembled position is in communication with the core of the at least one cable. The at least one second connector part is interconnected to the at least one cable positioning the core of the cable in a connected position with respect to the second port of the hollow conductor.

WO 18137997 A1 was first published in August 2018 on behalf of the same applicant. It is directed to a waveguide assembly which includes an elongated waveguide element and a connector body. The connector body is connected to an end of the elongated waveguide element and has a substantially planar bottom surface and an opposing top surface. The connector body is made from a single piece of partially metallized dielectric. The connector body has a waveguide coupling element adjacent to the elongated waveguide element. The connector body further has an arrangement of electromagnetic band gap elements adjacent to the waveguide coupling element.

U.S. Pat. No. 9,478,842 BA was first published in October 2016 on behalf of the California Institute of Technology. The publication is directed to a lens for interconnecting a metallic waveguide with a dielectric waveguide. The aim is to minimize a signal loss between the metallic waveguide and the dielectric waveguide.

US 2014285293 A2 was first published in September 2014 on behalf of Texas Instruments Inc. It is directed to a communication cable which includes a dielectric wave guide (DWG) that has a dielectric core member that has a first dielectric constant value and a cladding surrounding the dielectric core member that has a second dielectric constant value. The second dielectric constant value is lower than the first dielectric constant. An RJ45 compatible connector is attached to a mating end of the DWG. The RJ45 connector is configured to retain a complimentary coupling mechanism on a mating end of a second DWG.

The paper with the title "A 12.5+12.5 Gb/s Full-Duplex Plastic Waveguide Interconnect", published in IEEE JOURNAL OF SOLID-STATE CIRCUITS, VOL. 46, NO. 12, DECEMBER 2011, describes an interconnection which is based on a plastic waveguide. The system consists of a pair of transceivers and a plastic waveguide. Millimeter wave signal is transmitted in a low-cost long piece of solid plastic dielectric acting as a waveguide. The plastic waveguide medium offers a large bandwidth for data communication using mm-wave carrier frequencies. It is described that plastic wave-guide interconnects do not require costly electrical-to-optical and optical-to-electrical conversion devices or precise alignment and offer longer transmission distances than wireless solutions due to better field confinement and lower path loss.

The paper with the title "Design and Characterization of a Compact and Robust Shielded Dielectric Waveguide for mmW Applications", published in GeMiC2018, March 12-14, Freiburg, Germany, describes a dielectric waveguide concept for mmW-frequencies. To avoid typical problems of open structure waveguides like unshielded dielectric waveguides, a compact and still flexible design is proposed. To provide experimental results, a waveguide transition for metallic rectangular to round dielectric waveguides is characterized.

SUMMARY OF THE INVENTION

Hereinafter the term PMF, unless otherwise defined, means polymer microwave fiber. The chance to transmit high data rates at frequencies in the range of e.g., 100 GHZ to 200 GHZ with typical wave lengths in the range of Millimeters guided with just a simple plastic strip as PMF-wave guiding element generated a lot of research activities in the past.

Early attempts, as e.g., described in the first paper mentioned above, did focus on the general feasibility of the signal transmission and neglected practical issues caused by the effect that a significant portion of the electromagnetic wave propagates outside of the plastic strip and would result to significant leakage which is negative. One possibility to overcome this problem is to arrange the plastic stripes with sufficient spacing to other objects and especially other dielectric waveguides. Although this would be the simplest way to address the problem, it would not be applicable outside laboratory setups, as there are several disadvantages in practical use: The mechanical stability of the plastic stripes with cross-sections in the range about 0.5 mm to 3 mm would limit the length of the waveguide to some centimeters. Furthermore, touching or even getting close of the waveguide with any object or even pollution with dust particles in the surrounding atmosphere would cause significant signal loss and distortion. Reliable fixation of the waveguide is not solved. Under laboratory circumstances the plastic stripes are therefore often just a stick in a whole of the launching structure.

Another more practical attempt is to surround the plastic stripe, which acts as a waveguide, with a protective cladding. However, in this case other disadvantages appear: to concentrate the field in the plastic stripe, the permittivity of the cladding needs to be significantly smaller than the permittivity of the core. In addition, the cladding diameter usually needs to be sufficiently large, such that the electromagnetic leakage on the outside decays to an acceptable level. This field decay (leakage) depends on the difference of permittivity between core and cladding. However, if a resonant structure, this could be a metallic or dielectric part with dimension of multiple half-wavelength, would approximate the outer surface of the cladding, the resonance would increase even a weak coupling by some order of magnitudes. For low loss waveguides operating e.g., in the range of 110 GHz to 140 GHz this typically would result in a cladding having a diameter in the range of 6 mm to 10 mm.

In another attempt, which is described in the second paper mentioned above, the plastic waveguide is surrounded with a protective cladding and a metallic shield. Although the advantages would be a stable signal transmission independent of the surrounding environmental objects, touching and cross talk, and a certain reduction of the overall dielectric cable diameter, the drawbacks are a significant increase in complexity and much higher effort in fabrication as multimode propagation may cause serious dispersion issues. A commercially applicable plastic waveguide solution should, compared to other data cable solutions, such as e.g., twisted pair cables, remain as simple and cost effective.

Therefore, while moving from a simple plastic stripe (as maybe applicable in a laboratory setup) to a robust product which is applicable to mass production, some additional problems must be solved.

The outer diameter of a polymer microwave fiber cable strongly depends on the operational wavelength. Though, with specific material combinations the outer cable dimension can be reduced. As all known dielectric materials with a relative permittivity higher than 2.6 have a high loss tangent factors or even order of magnitudes higher than low loss materials like PTFE, PP or PE. Beside the loss tangent, the reduced propagation speed of the wave for higher permittivity materials causes a loss increase simply by the virtual increase of the cable length. Increasing the operating frequency would result in smaller operational wavelength and so allow to reduce the cable diameter in a linear way (e.g. double the operating frequency=half cable diameter) keeping the low loss/low permittivity materials, but low cost mass production silicon based semiconductor technology is today limited in the maximum operation frequency somewhere around 140 GHz to 170 GHz. At these frequencies cladded DWG cable will end up in outer diameters >5 mm to 7 mm. A shielding structure protecting the cable against touch sensitivity and cross-talk would definitely make the transmission more robust, even when the cladding diameter is reduced but with the additional metal foil and jacket the outer cable diameter will still stay above 5 mm.

When compared to the diameter of a cable which is in the range of 5 mm to 7 mm (made from low loss material at 140 GHz), the necessary typical dimension of a transceiver silicon die is significantly smaller, usually in the range of 1 mm by 1 mm. A high speed data transceiver should be located on a PCB as close as possible to the component acting as data origin/sink, as the maximum routing distance for high speed bus are usually limited (typical for 25 GBit/s<25 cm) and cost driving. For duplex operation and/or parallelization multiple cable links may be required, such that the necessary space by the cable causes strong design limitations. A fan out element realized as air filled metal waveguide as proposed in WO 2019072571 A1 of the same applicant address this issue.

By an appropriate material combination with different dielectric permittivity as described in PCT/EP2019/084547 of the same applicant (hereinafter referenced as /1/), which is hereby incorporated by reference with respect to the PMF-cables, it is possible to confine the electromagnetic field significantly more in the fiber core allowing much thinner dielectric waveguide diameter. The collateral deterioration of wave-guide attenuation usually hinders the use of very thin PMF-cables over longer distances. Nevertheless, for realizing a fan out section bridging some centimeters or decimeters such PMF cables do provide an interesting option, but an additional part with an additional interface would increase the number of parts, the material and assembling cost as well as the misalignment tolerances and the number of failure options To address the above mentioned problems, a PMF-transceiver according to the present disclosure comprises a housing with a recess in which a printed circuit board (also referred to a PCB) is arranged and positioned with respect to the housing. The printed circuit board comprises or is interconnected to at least one radiating element. The radiating element is in a mounted position (during operation) interconnected to a PMF-cable by a PMF-interposer which will be described hereinafter in more detail. The PMF-interposer is arranged in the housing between the radiating element (antenna) and the PMF-cable. The PMF-interposer usually comprises a main body arranged in a cavity of the housing and/or another part extending in a longitudinal direction of the housing between the radiating element and the PMF-cable. The PMF-interposer may be arranged coaxial with respect to the cavity. Other arrangements are possible. The interposer may have a cross-section which is polarization maintaining, e.g., rectangular or elliptic or a circular cross-section which is not maintaining the polarization.

The cavity may have a constant and/or variable cross-section over the length of the interposer. The cavity preferably comprises a conductive surface acting as a shield for the signal transmitted by the interposer between the radiating element and the core of the PMF-cable. The conductive surface is preferably arranged in the direction of the interposer. Good results can be achieved when the housing is made from metal alloy e.g., by diecasting. In a preferred and easy to assemble variation, the housing comprises a lower part and an upper part which in an assembled position are interconnected to each other along a first and a second interaction surface which at least partially correspond to each other. The cavity extends in and along the first and the second interaction surface. When disassembled, a first half of the cavity is arranged in the upper part and a second half in the lower part of the housing. If appropriate an EBG-structure extends along the cavity in the first and a second interaction surface. EBG-structure refers to electromagnetic band-gap structure which creates a stop-band to block electromagnetic waves of certain frequency bands. The EBG-structure can e.g., be achieved by a fine, periodic pattern of small metal patches or bores in the upper and/or lower part of the housing. To reduce manufacturing cost, good results can be achieved when the housing is made by diecasting. However, in mass production the achievable accuracies and tolerances are moderate. As mentioned above the interposer could significantly contribute to suffer under coarse tolerances. The limited accuracy may result in gap dimensions between housing elements which would not provide sufficient isolation in mm-wave frequencies. Therefore, a specific EBG structure as for example glide symmetries are foreseen to achieve significantly better crosstalk isolation. The PMF-interposer may comprise a compensation structure to compensate a mismatch between an impedance of the PMF interposer and the impedance of the PMF cable. Good results can be achieved when the compensation structure is arranged at the end of the PMF-interposer in the direction of the core of the PMF-cable. In a preferred variation, the main body of the PMF-interposer is spatially curved s-shaped to compensate lateral offset of a main axis of the radiating element and the core of the PMF-cable. Good results can be achieved when the PMF-interposer is arranged in a pretensioned manner in the cavity. For good signal transmission, the PMF-interposer may be arranged pressing in a mounted position against the PMF-cable. The PMF-interposer may comprise at least one supporting element to position the PMF-interposer with respect to the cavity. Good results can be achieved, when the PMF-interposer is interconnected by a horn-antenna to the radiating element (source and/or sink of signal). To reduce manufacturing cost, the PMF-interposer may be made by injection molding of plastic material. Depending on the field of application, the PMF-interposer can be made by two-component injection molding. The housing may form part of the antenna.

The PMF-interposer offers the advantage of higher performance and a significantly reduced complexity down to one single part which can be preferably made from plastic material as mentioned above and hereinafter. The PMF-interposer may address at least one of the following aspects: It forms part of a waveguide fan out structure between a dense antenna structure of one or multiple co-located transmitter and/or receiver components and the larger diameter PMF cable group or bundle. If appropriate, this waveguide may include multiple permittivity areas as described in the above referenced application /1/ namely to flatten group delay variation. In a preferred variation, the multiple permittivity areas can e.g., be achieved by two component injection molding and/or foamed and/or micro-structured sections lowering the permittivity in desired areas. If required, groups of multiple PMF Interposer may be realized in one single part. Furthermore, these elements can be designed as spring elements allowing to compensate tolerances from all involved parts. Further filigree positioning elements may be used to group multiple PMF interposers. The reduced number of involved parts and the self-aligning structure help to keep mechanical tolerances under control. The PMF interposer may act as an RF-compensation structure toward the PMF cable providing impedance matching from the desired H11 Modes in both waveguides ideally without being forward and backward transformed in the metal TE01 waveguide mode. This will improve the coupling of electromagnetic energy, reduce losses, multi-mode interference and lower the risk for coupling to undesired interferer. Further it allows to open the mechanical misalignment tolerances for signal transmission and still maintaining the desired transmission conditions. Optionally, a variable length by stretchable or elastic sections can further ease to cope with mechanical tolerances along the direction of transmission. To attach the PMF-cable in a fixed manner to the housing, the housing may comprise a mount to fix the PMF-cable e.g., by glue. Other variations are possible. The mount is usually arranged at the opposite end of the housing with respect to the PCB. A PMF-assembly according to the present disclosure usually comprises at least one PMF-transceiver as described above and hereinafter and a PMF-cable in a mounted position interconnected to the PMF-transceiver. Good results can be achieved when the PMF-transceiver and the PMF-cable are interconnected to each other in a fixed manner and/or when at each end of the PMF-cable a transceiver is interconnected to the cable in the described manner. In a preferred variation, the PMF-assembly comprises two PMF-cables arranged essentially parallel with respect to each other, wherein each cable at both ends is directed to a PMF-transceiver as described herein. Depending on the field of application, a PMF-transceiver may be designed to interconnect to a single cable, to two cables or more cables. A PMF-transceiver can be foreseen to send and/or receive data.

In high speed Ethernet data communication between apparatus in telecommunication and data communication a compact, hot-pluggable interface module called "small form-factor pluggable" (SFP-standard) transceiver is widely used. With evolving data rates further partly downward compatible variants with higher speed grades like SFP+; SFP28, QSFP and QSFP56 where developed. Today there exist three different types of physical data transmission: passive direct attached copper cables, active direct attached copper cables and active optical cables.

The active Polymer Microwave Fiber (PMF) Device and Module according to the present disclosure closes the gap between the high data-rate long range expensive optical technology and the data-rate and cable length limited multi-twin axial cooper cable based transmission, which is usually less expensive. The PMF variant may provide even lower cost compared to cooper cables while still allowing operation with higher data rate and/or cable length.

To achieve this goals lowest electrical loss material with low permittivity are usually most desired cable basis polymer. Good results can be achieved by materials from the polymer group of Polyolefin (e.g., Polyethylene, Polypropylene). There materials provide comparably low electrical loss and environmentally robust behavior, but as well a low cost polymer.

To operate in full duplex operation or to increase data rate it is usually desirable to use two wave guiding cables per PMF-transceiver e.g., in the form of an SFP module. Unfortunately, the low loss requirement at the targeted operation frequency range around 130 GHz require cable outer diameter larger than 5 mm. So, it is not possible to feed two parallel cables directly into the standardized dimension of an SFP module, as a side by side cable arrangement of two cables, whereby each cable is having a diameter of e.g., 6.5 mm in front of the connector would fit to the minimum connector spacing of 13.4 mm between SFP modules. This problem can be addressed by an PMF-interposer which bridges the geometrical needs.

In a preferred variation, a printed circuit board (PCB) arranged inside the SFP usually comprises the relevant electronic elements for high speed multi-port connection and the at least one mm-wave antenna for sending an/or receiving the signal. The height of the SFP module is defined by the standard for SFP modules. A side firing antenna, e.g., a Vivaldi or SIW-horn antenna, needs to be interconnected to the PMF cable, respectively its center axis. To overcome the problem that due to limited dimension a PMF-cable having a diameter of e.g., 6.5 mm cannot be placed ending inside a standardized SFP module the present disclosure foresees a so called PMF interposer which interconnects the antenna preferably arranged on the PCB with the PMF cable end which can be positioned outside of the SFP cage.

If appropriate, an RF compensation structure provides an impedance match between the impedance of the antenna and the PMF interposer. This compensation structure may be designed self-aligning between the antenna the PMF interposer. This helps to reduce transmission distortion (S-parameter degradation in forward and backward direction) even when misalignment occurs due to potentially present production tolerances.

In a preferred variation, the antenna is incorporated as an H-plane substrate integrated horn antenna (preferably PCB SIW horn) elongated by a metallic horn which discharges into a metallic cavity acting as a shield for the dielectric waveguide can provide perfect cross-talk isolation between adjacent channels to avoid distortion by multi-mode propagation and/or cavity resonances, it is important that the antenna excite only the desired H11 mode in the interposer. Any abrupt permittivity change generates field distortion exciting unwanted other modes. The transition from the PCB SIW horn to an air filled metallic horn cause an impedance step and further the air filled horn to the (high permittivity) PMF interposer cause again an impedance step. An integrated RF compensation structure maybe integrated by injection molding on a tip of the interposer could wideband compensate such impedance step and so significantly improve the otherwise strongly deteriorated S-parameter of this launcher.

The disadvantage of the impedance steps is often bypassed in the literature using Vivaldi-antennas (e.g., directly attached to a PMF cable in laboratory conditions with no air gap), but this type of launchers suffers from cavity resonances when metallic shielding structures completely surrounding the Vivaldi antenna get mandatory (like in a close side by side arrangement).

Further an integrated RF compensation structure (e.g., lens) could provide an impedance match between PMF interposer and PMF cable impedance. The higher permittivity material of the PMF interposer compared to the permittivity of the cable core and the surrounding air around the interposer compared to the higher permittivity cladding in the PMF cable combined with a tolerance induced gap between both cores would result in severe S-parameter deterioration and cavity-mode resonances. An integrated RF compensation structure (e.g. lens) injection molded on the tip of the interposer can reduce transmission distortion even when misalignment introduced by (low cost) production tolerances occur.

Further integrated filigree supporting elements which are almost transparent for the electromagnetic wave could position and hold the PMF interposer in the designed location without reducing the field confinement as any cladding material would do. A spring-loaded bending of the supporting elements may compensate for mechanical tolerances helping to control the air gap between interposer and antenna or inter-poser and PMF cable. Further optional an elastic section of the interposer could allow to control both air gaps Higher permittivity material for the PMF interposer allow for more field confinement and so for thinner waveguides. As the length of the PMF interposer is comparable small to the length of the cable the increase of total attenuation stays small. Relative permittivity values from e.g., 3 . . . 100 may be used whereby the diameter of the PMF interposer waveguide follows the square-root of the relative permittivity value.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

BRIEF DESCRIPTION OF SEVERAL VIEWS OF THE DRAWINGS

The herein described disclosure will be more fully understood from the detailed description given herein below and the accompanying drawings which should not be considered limiting to the disclosure described in the appended claims. The drawings are showing:

DETAILED DESCRIPTION OF THE INVENTION

Reference will now be made in detail to certain embodiments, examples of which are illustrated in the accompanying drawings, in which some, but not all features are shown. Indeed, embodiments disclosed herein may be embodied in many different forms and should not be construed as limited to the embodiments set forth herein; rather, these embodiments are provided so that this disclosure will satisfy applicable legal requirements. Whenever possible, like reference numbers will be used to refer to like components or parts.

Figure 1:
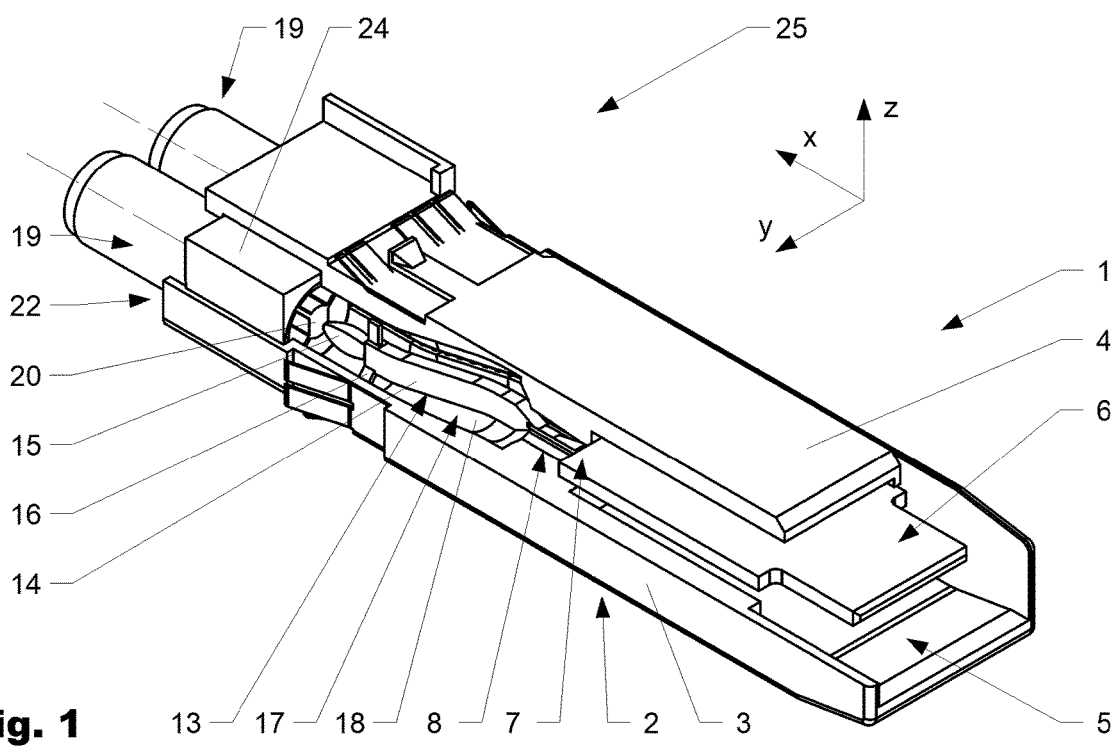
FIG. 1 shows a PMF-transceiver shown partially sectioned in perspective view.
Figure 2:
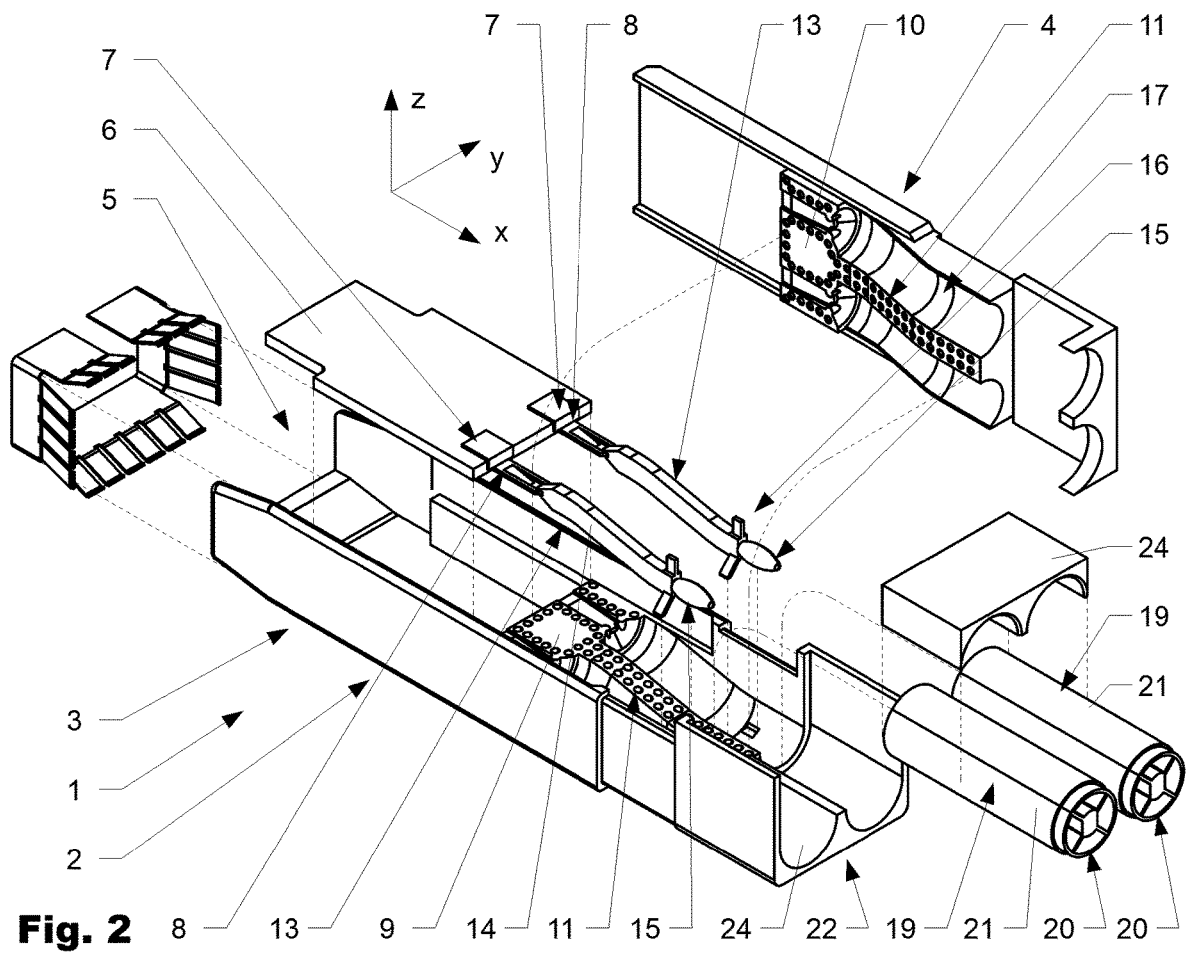
FIG. 2 shows the PMF-transceiver according to FIG. 1 in an exploded view.
Figure 3:
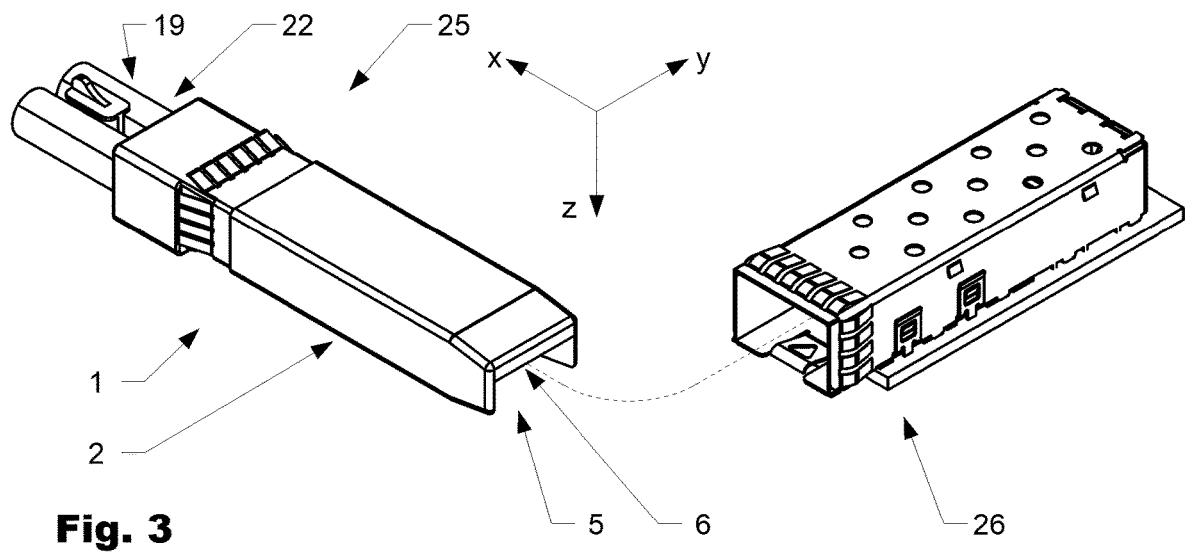
FIG. 3 shows the PMF-transceiver as an SFP-module in an unplugged state.
Figure 4:
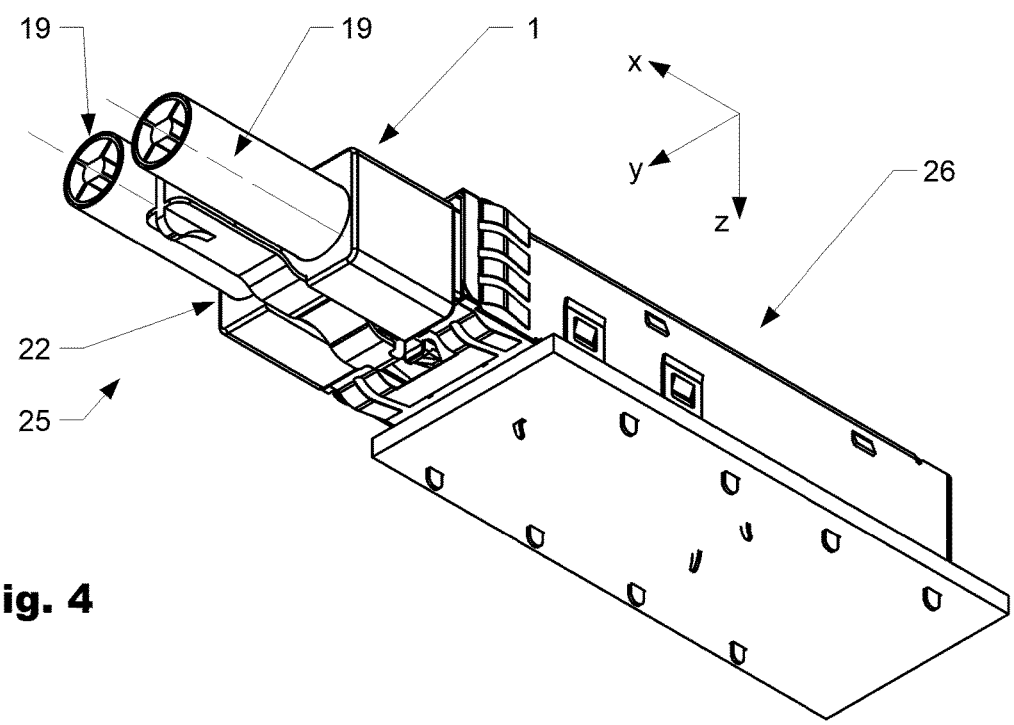
FIG. 4 shows the PMF-transceiver according to FIG. 3 plugged into a socket.

FIG. 1 shows a PMF-transceiver 1 according to the present disclosure from above in a perspective view. The PMF-transceiver 1 is shown in a partially sectioned view. FIG. 2 shows the PMF-transceiver 1 in an exploded view. Directions of disassembly are indicated by dotted lines. FIG. 3 shows the PMF-transceiver 1 from below in an unplugged state spaced apart from an appropriate socket 26. FIG. 4 shows the PMF-transceiver 1 in a plugged state with the socket 26. The PMF-transceiver 1 comprises in the shown variation a housing 2 with a recess 5 in which a printed circuit board 6 (PCB) is arranged and accessible from the outside for electrical interconnection. As indicated, the housing 2 comprises a lower part 3 and an upper part 4 which in the assembled position are connected to each other along a first and a second interaction surface 9, 10. The printed circuit board 6 comprises at least one radiating element 7 being in a mounted position interconnected to a thereto related PMF-cable 19 by a PMF-interposer 13 arranged between the printed circuit board 6 and the PMF-cable 19. In the shown variation, the radiating element 7 is coupled by an antenna 8 to the rear end of the interposer. The rear end of the interposer and/or the cavity may form part of the antenna 8. The PMF-cable 19 usually comprises a core 20 which is surrounded by a cladding 21. In the drawings, only a small section of the cable is shown. Good results can be achieved, when the cable 19 is of the type as described in /1/ which is incorporated by reference in this application. In the shown variation, the PMF-transceiver is designed to connect to two cables 19 which are arranged essentially parallel. Both cables 19 are interconnected to a respective radiating element 7 by an PMF-interposer 13 which will be described in more detail hereinafter. The PMF-interposer 13 comprises a main body 14 which in the mounted position (see FIG. 1) is arranged in a cavity 17 in the housing 2 extending between the radiating element 7 and the PMF-cable 19. The PMF-interposer 13 is arranged in the cavity 17. The cavity 17 comprises a conductive inner surface 18 acting as a shield for the signal transmitted by the interposer 13 between the radiating element 7 and the core 19 of the PMF-cable 19. The conductive surface 18 can be achieved in that the material of the housing is sufficiently conductive, e.g., in the form of an appropriate metal alloy and/or a coating (not shown in detail) of the surface of the cavity. In the shown variation, the cavity 17 extends in and along the first and the second interaction surface 9, 10. Essentially half of the cavity 17 is arranged in the lower part 3 and the upper part 4 of the housing 2. To compensate tolerances, an EBG-structure 11 formed by a series of small bores extends along the cavity 17 in the first and a second interaction surface 9, 10. If appropriate, the PMF-interposer 13 may comprise a compensation structure 15 to compensate a mismatch between the impedance of the PMF interposer 13 and the impedance of the PMF cable 19. In the shown variation, the compensation structure 15 is lens-shaped arranged at the end of the PMF-interposer 13 in the direction of the core 20 of the PMF-cable 19. Depending on the design, other arrangements are possible. The compensation structure 15 may be designed to act as an electromagnetic field shaping structure. To compensate geometrical mismatches between the axis of the radiating elements 7, respectively the antenna 8, the main body 14 of the PMF-interposer 13 can be curved s-shaped as shown. Good results can be achieved when the PMF-interposer 13 is arranged in a pretensioned manner in the cavity 17 with respect to its longitudinal direction. For optimized signal transmission, the PMF-interposer 13 may be arranged pressing in a mounted position against the PMF-cable 19. As shown, the PMF-interposer 13 may comprise at least one supporting element 16 to position the PMF-interposer 13 with respect to the cavity 17. In the shown variation, the support structure comprises thing legs 17 which extend in a radial direction. Good results can be achieved, when the PMF-interposer 13 is interconnected by a horn antenna 8 to the radiating element 7. The housing 2 may form part of the horn antenna. Alternatively, or in addition, other elements may form part of the horn antenna 8. The PMF-interposer 13 is made by injection molding of plastic material of a single component or by multi-component injection molding. The housing 2 is preferably made by diecasting of a metal alloy. To attach the cable, the housing 2 may comprise a mount 22 to fix the PMF-cable 19 to the housing 2. In the shown variation, the PMF-transceiver is designed according to the standard of SFP-Modules (SFP=Small Form-factor Pluggable). In FIG. 3 the PMF-transceiver 1 is arranged outside of a corresponding socket 26, and in FIG. 4 the PMF-transceiver 1 is shown in a plugged state inside the socket 26. While the printed circuit board 6 and the thereon arranged elements (not visible) are in the plugged state arranged inside the socket 26, the PMF-cables 19, respectively the mount 22 for them are arranged outside of the socket 26. The distance between the printed circuit board 6, respectively the thereto interconnected active elements, and the PMF-cable 19 is bridged by the PMF-interposer 13 as described above and claimed hereinafter. No need exists that the PMF-cables 19 reach inside the socket 26.

Rather, the words used in the specification are words of description rather than limitation, and it is understood that various changes may be made without departing from the Spirit and scope of the disclosure.

The invention claimed is:

1. A polymer microwave fiber (PMF)-transceiver (1) comprising:
   a. a housing (2) with a recess (5) in which a printed circuit board (6) is arranged,
   b. at least one radiating element (7) in a mounted position inter-connected to a thereto related PMF-cable (18) by a PMF-interposer (13) arranged between the radiating element (7) and the PMF-cable (18) and comprising a main body (14) arranged in a cavity (17) in the housing (2) extending between the radiating element (7) and the PMF-cable (19).

2. The PMF-transceiver (1) according to claim 1, wherein the PMF-interposer (13) is encompassed completely by the cavity (17).

3. The PMF-transceiver (1) according to claim 1, wherein the cavity (17) comprises a conductive surface (18) acting as a shield for the signal transmitted by the interposer (13) between the radiating element (7) and the core (19) of the PMF-cable (19).

4. The PMF-transceiver (1) according to claim 1, wherein the housing (2) comprises a lower part (3) and an upper part (4) which are connected to each other along a first and a second interaction surface (9, 10).

5. The PMF-transceiver (1) according to claim 4, wherein the cavity (17) extends in and along the first and the second interaction surface (9, 10).

6. The PMF-transceiver (1) according to claim 5, wherein an EBG-structure (11) extends along the cavity (17) in the first and a second interaction surface (9, 10).

7. The PMF-transceiver (1) according to claim 1, wherein the PMF-interposer (13) comprises a compensation structure (15) to compensate a mismatch between an impedance of the PMF interposer (13) and the impedance of the PMF cable (19).

8. The PMF-transceiver (1) according to claim 7, wherein the compensation structure (15) is arranged at an end of the PMF-interposer (13) in the direction of the core (20) of the PMF-cable (19).

9. The PMF-transceiver (1) according to claim 1, wherein the main body (14) of the PMF-interposer (13) is curved s-shaped.

10. The PMF-transceiver (1) according to claim 1, wherein the PMF-interposer (13) is arranged in a pretensioned manner in the cavity (17).

11. The PMF-transceiver (1) according to claim 1, wherein the PMF-interposer (13) presses in a mounted position against the PMF-cable (19).

12. The PMF-transceiver (1) according to claim 1, wherein the main body (14) of the PMF-interposer (13) comprises a cross-section which is polarization maintaining or a circular cross-section.

13. The PMF-transceiver (1) according to claim 1, wherein the PMF-interposer (13) comprises at least one supporting element (16) to position the PMF-interposer (13) with respect to the cavity (17).

14. The PMF-transceiver (1) according to claim 1, wherein the PMF-interposer (13) is interconnected by a horn-antenna (8) to the radiating element (7).

15. The PMF-transceiver (1) according to claim 14, wherein the PMF-interposer (13) and/or the cavity (17) form part of the horn-antenna (8).

16. The PMF-transceiver (1) according to claim 1, wherein the PMF-interposer (13) is made by injection molding of plastic material.

17. The PMF-transceiver (1) according to claim 1, wherein the housing (2) is at least partially made by diecast of a metal alloy.

18. The PMF-transceiver (1) according to claim 1, wherein the housing (2) comprises a mount (22) to fix the PMF-cable (19) to the housing (2).

19. The PMF-transceiver (1) according to claim 1, wherein the PMF-transceiver (1) is designed as a hot-pluggable interface module according to the SFP-standard.

20. A PMF-assembly (25) comprising at least one PMF-transceiver (1) according to claim 1 and a PMF-cable (19) in a mounted position interconnected to the PMF-transceiver (1).

\* \* \* \* \*